(12) United States Patent
Chen et al.

(10) Patent No.: US 8,749,036 B2
(45) Date of Patent: Jun. 10, 2014

(54) MICROCHIP WITH BLOCKING APPARATUS AND METHOD OF FABRICATING MICROCHIP

(71) Applicant: Analog Devices, Inc., Norwood, MA (US)

(72) Inventors: Li Chen, Belmont, MA (US); Thomas Kieran Nunan, Carlisle, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 8 days.

(21) Appl. No.: 13/673,124

(22) Filed: Nov. 9, 2012

(65) Prior Publication Data
US 2014/0131850 A1 May 15, 2014

(51) Int. Cl.
*H01L 23/06* (2006.01)
*H01L 23/02* (2006.01)
*H01L 23/34* (2006.01)

(52) U.S. Cl.
USPC .... 257/684; 257/686; 257/723; 257/E25.031; 257/E25.032

(58) Field of Classification Search
USPC ......... 257/684, 686, 723, 724, 731, 782, 783, 257/786, E25.031, E25.032, E23.042, 257/E25.006, E25.013, E25.018, E25.021, 257/E25.027, E21.614, E23.085
See application file for complete search history.

(56) References Cited

U.S. PATENT DOCUMENTS

| | | | |
|---|---|---|---|
| 5,869,760 A | 2/1999 | Geen | 73/504.12 |
| 6,148,670 A | 11/2000 | Judy | 73/514.32 |
| 6,284,567 B1 | 9/2001 | Park | 438/107 |
| 6,768,207 B2 | 7/2004 | Tao et al. | 257/777 |
| 6,936,918 B2 | 8/2005 | Harney et al. | 257/704 |
| 7,034,393 B2 | 4/2006 | Alie et al. | 257/704 |
| 7,611,926 B2 | 11/2009 | Takamoto et al. | 438/118 |
| 7,948,043 B2 | 5/2011 | Kim et al. | 257/415 |
| 8,058,143 B2 | 11/2011 | Montez et al. | 438/456 |
| 2009/0170299 A1* | 7/2009 | Lee | 438/533 |
| 2011/0121412 A1* | 5/2011 | Quevy et al. | 257/415 |
| 2012/0256308 A1* | 10/2012 | Helin | 257/704 |

* cited by examiner

*Primary Examiner* — Matthew Reames
*Assistant Examiner* — Dilinh Nguyen
(74) *Attorney, Agent, or Firm* — Sunstein Kann Murphy & Timbers LLP

(57) ABSTRACT

A microchip has a base die with a conductive interconnect and an isolation trench around at least a portion of the conductive interconnect, and a cap die secured to the base die. A seal, formed from a metal material, is positioned between the base die and the cap die to secure them together. The microchip also has a blocking apparatus, between the isolation trench and the metal seal, that at least in part prevents the metal material from contacting the interconnect.

7 Claims, 8 Drawing Sheets

MICROCHIP WITH BLOCKING APPARATUS AND METHOD OF FABRICATING MICROCHIP

FIELD OF THE INVENTION

The invention generally relates to microchips and, more particularly, the invention relates to bonding microchips together.

BACKGROUND OF THE INVENTION

A wide variety of microchips use caps to protect their interior components. For example, micro-electromechanical systems ("MEMS devices") often have a cap to protect their fragile microstructure. Many MEMS devices typically have a glass seal to bond the silicon die caps to the underlying MEMS chip. Such a seal, which can be hermetic, may have widths on the order of about 150 to 400 microns. Undesirably, this seal footprint increases die size. As a consequence, fewer dies/microchips can be formed from individual wafers, thus increasing per-unit fabrication costs.

The art has responded to this problem by using metal to bond the cap dies/wafers to the underlying device dies/wafers. Specifically, metal can provide bonds and hermeticity comparable to seal glass, but with smaller widths. Accordingly, metal bonds/seals effectively increase the number of dies that can be formed on a single wafer. To those ends, conventional processes often heat the metal to its melting point and apply pressure to produce a strong bond.

SUMMARY OF THE INVENTION

The inventors discovered that metal bonds in their liquid form (i.e., during the bonding step of fabrication) often oozes onto the underlying die, consequently compromising the integrity and performance of the ultimately produced microchip. For example, the inventors noticed that this liquid metal can contact the interconnect pads, causing a short circuit. This often produces significant yield loss, thus increasing microchip fabrication costs.

In accordance with one embodiment of the invention, a method of forming a microchip provides a base die and a cap die. The base die has a top surface with an exposed conductive interconnect, and an isolation trench around the conductive interconnect. The method also adds metal to one or both the cap die and the base die, and places the cap die and base die together to form an intermediate apparatus having a blocking apparatus. The intermediate apparatus forms an uncured metal seal from the added metal on the one or both dies. The blocking apparatus is positioned between the uncured metal seal and the interconnect. Metal from the uncured metal seal migrates toward the conductive interconnect. The blocking apparatus thus contacts the migrating metal to prevent such metal from contacting the interconnect—and preferably from electrically connecting the interconnect and the metal seal. Finally, the method allows the metal seal to cool, forming a metal seal.

The metal material may be an alloy that at least partially liquefies at the eutectic point of the alloy. For example, the alloy may include aluminum and germanium. The base die may have MEMS microstructure, and the cap die may include circuitry. Alternatively, the cap die may be free of circuitry (e.g., a solid piece of material). The seal and blocking apparatus may having the same potential (i.e., they are considered to be the same electrical node), while the electrical interconnect may have another potential and thus, be electrically isolated from the seal and blocking apparatus.

The blocking apparatus may be any of a number of different devices. For example, the blocking apparatus may include a trench etched in the base die. In that case, the trench may contain metal material having substantially the same composition as the seal. The metal in this embodiment may have leaked from the seal and into the trench. The trench may have a top opening and a cavity having a larger inner dimension than that of the top opening.

Alternatively, the blocking apparatus may include a protrusion extending downwardly from the cap die, where the protrusion is spaced from and does not contact the base die. In that case, the blocking apparatus may be in contact with metal material having substantially the same composition as the seal. As with the trench embodiment, some of that material may have leaked from the seal during bonding.

In accordance with another embodiment of the invention, a microchip has a base die secured to a cap die. The base die has a top surface with an exposed conductive interconnect, and an isolation trench around at least a portion of the conductive interconnect. The base die also has two opposed sides—namely, a first side and a second side. The conductive interconnect is positioned closer to the first side than it is to the second side. The microchip also has a seal between the base and the cap. The seal secures the base die with the cap die and includes a metal material. A blocking trench is in the base die between the isolation trench and the metal seal. More specifically, the blocking trench is formed between the first side and the isolation trench for at least in part preventing the metal material from electrically contacting the interconnect with the seal. The blocking trench may not fully surround the isolation trench.

In accordance with another embodiment, a microchip has a base die with a conductive interconnect and an isolation trench around at least a portion of the conductive interconnect, and a cap die secured to the base die. A seal, formed from a metal material, is positioned between the base die and the cap die to secure them together. The microchip also has a protrusion, which extends downwardly from the cap die. The protrusion is spaced from, and does not contact, the base die. The protrusion at least in part prevents the metal material from contacting both the interconnect and the seal.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a microchip is configured to minimize yield loss during fabrication. To that end, the microchip has a blocking apparatus that, during fabrication, prevents liquid metal from electrically connecting its electrical interconnect (e.g., a bond pad) with a metal seal coupling its cap and base dies. For example, among other things, the blocking apparatus may include a blocking trench in the base wafer to capture overflowing liquid metal during the fabrication process. As a second example, the blocking apparatus also may include a protrusion, extending downwardly from the cap wafer, that uses surface tension to retain the liquid metal. Details of illustrative embodiments are discussed below.

Figure 1:
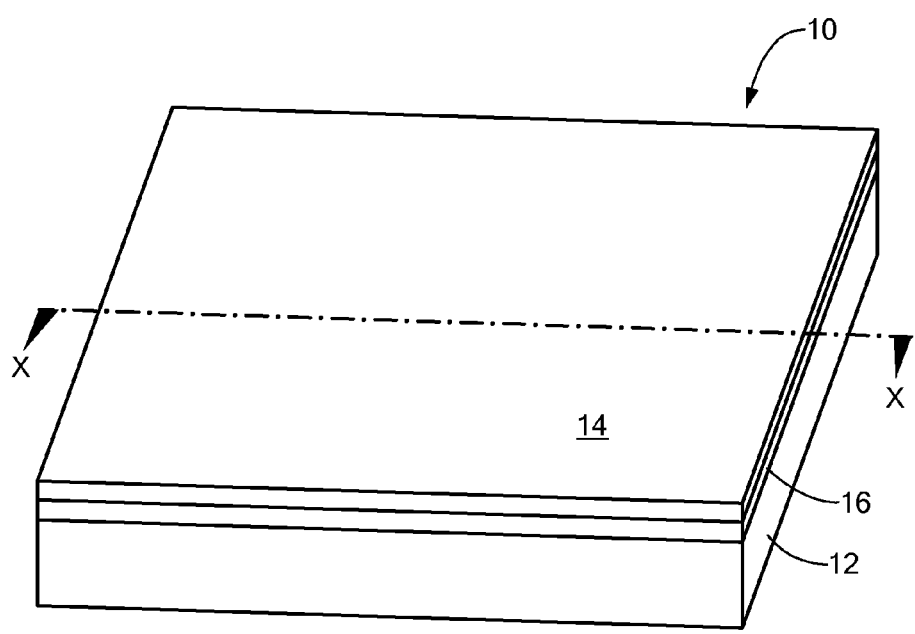
FIG. 1 schematically shows a perspective view of a microchip configured in accordance with illustrative embodiments of the invention.

FIG. 1 schematically shows a microchip 10 that may be configured in accordance with illustrative embodiments of the invention. Specifically, the microchip 10 may be considered to be a wafer level chip scale package ("WLCSP") formed from two dies 12 and 14 bonded together with a metal alloy. In particular, the microchip 10 has a base die 12 containing functional components (e.g., sensing elements), and a cap die 14, bonded to the base die 12, for protecting the functional components of the base die 12.

The base die 12 may contain any of a number of different types of functional components. In illustrative embodiments, the base die 12 is a MEMS die (i.e., "micro-electromechanical system" die) having microstructure 26 (FIGS. 2B and 4B) for measuring or sensing some environmental quality. For example, the MEMS die may implement the functionality of an accelerometer, a gyroscope, a pressure sensor, a microphone, a speaker, an ultrasonic transducer, or any other of a number of different, commonly used MEMS devices.

Any of a number of different general implementations for the MEMS die/base die 12 should suffice. For example, when implemented as an accelerometer, the microstructure 26 may, in relevant part, be similar the accelerometer disclosed by U.S. Pat. No. 6,148,670, the disclosure of which is incorporated herein, in its entirety, by reference. As another example, when implemented as a gyroscope, the microstructure 26 may, in relevant part, be similar to the gyroscope disclosed in U.S. Pat. No. 5,869,760 the disclosure of which, is incorporated herein in its entirety, by reference. Of course, discussion of specific gyroscopes and accelerometers is for illustrative purposes only and not intended to limit various embodiments the invention.

The cap die 14 bonds to the base die 12 to form a chamber protecting the fragile microstructure 26. To that end, the cap die 14 can primarily include an inactive component, such as a portion of a bulk silicon wafer. In that case, among other things, the cap die 14 can be substantially flat, have walls, or some other structure that forms the interior chamber. Other embodiments, however, may use a cap die 14 having active components, such as electronic circuit elements 18 and/or microstructure 26. The circuit elements 18 may include circuitry conventionally used with conventional MEMS devices. For example, the circuitry may include preamplifiers, amplifiers, power circuitry, actuation circuitry, clocks, self-test circuitry, and detection circuitry, among other things.

In alternative embodiments, some or all of the circuit elements 18 also may be formed on the base die 12. In that case, the circuit elements 18 of the cap die 14 may cooperate with the circuit elements 18 of the base die 12.

In some embodiments, the chamber is hermetically sealed, thus preventing contaminants, air, or other environmental materials from contacting the microstructure 26. Moreover, the chamber may also contain a relatively high viscosity buffering gas for further protecting the fragile microstructure 26. The hermetic seal thus is important for maintaining this gas within the device, thus extending the lifetime of the microchip 10.

Illustrative embodiments use a metal seal 16 to form the connection between the cap die 14 and the base die 12. Among other things, the metal seal 16 may include an alloy, such as aluminum/germanium and/or other metals. For example, an aluminum/germanium metal seal 16 also may have small or trace amounts of other metals. The metal seal 16 preferably electrically connects the cap die 14 with the base die 12 to form a single potential. This should reduce the risk of short-circuits and improve device performance.

During fabrication, in particular when bonding the two dies together, the inventors discovered a problem with certain metal alloys. Specifically, the inventors discovered that when the metal alloy liquefies, it often leaks onto other portions of one or both dies. This phenomenon is particularly problematic when the cap and base dies 12 and 14 are brought together under pressure.

More particularly, the two primary metals alone often have a fairly high melting point; one that is much higher than their combined eutectic point. Accordingly, when the metals combine to form an alloy, they rapidly liquefy and ooze/flow onto other portions of the die. For example, the alloy undesirably may flow from the metal seal 16 and onto an electrical interconnect 20. This undesirably causes a short circuit to the metal seal 16, typically rendering the entire microchip 10 unusable. This has been particularly problematic to the inventors, often resulting in significant yield loss during fabrication. For example, the yield loss from this problem alone can approach 30 to 40 percent. Such a high yield loss consequently substantially increases the cost of fabricating each usable microchip.

One solution simply uses a different alloy that does not so readily liquefy. Undesirably, this solution substantially limits the alloys that may be used. Accordingly, after experimentation, the inventors discovered that they can continue using a wide variety of alloys by employing a blocking apparatus 34 between the electrical interconnects 20 and the metal seal 16 around the microchip 10. For example, this solution has been shown to work well with an aluminum/germanium metal seal 16. One type of blocking apparatus 34 captures the excess flowing alloy in a well or trench, while the other simply blocks the alloy using surface tension. Details of various embodiments are discussed below.

It should be noted that aluminum/germanium is discussed for illustrative purposes only. Those skilled in the art therefore should understand that aluminum/germanium is but one type of metal alloy that may bond the two dies together in accordance with illustrative embodiments. Other alloys and metals may be used to achieve the benefits of various embodiments.

FIGS. 2A-2C and 3 schematically show one embodiment of the invention, in which the base die 12 has a plurality of precisely positioned blocking trenches 34A to capture overflowing liquid metal from the metal seal 16. Each blocking trench 34A is positioned around at least a portion of at least one interconnect pad 20 exposed on the top surface of the base die 12—namely, between the metal seal 16 and the pad 20.

Figure 2A:
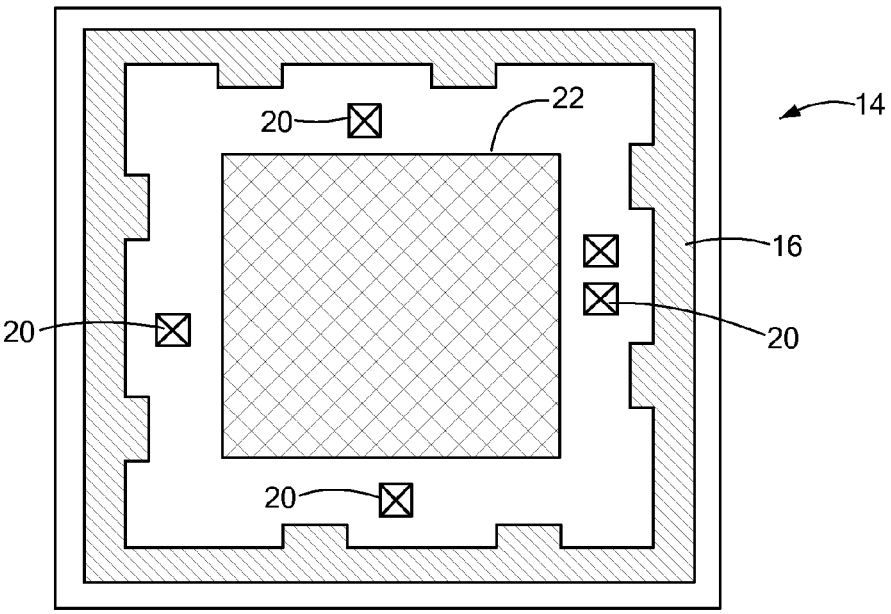
FIG. 2A schematically shows a plan view of a cap die with circuitry in accordance with a first embodiment of the invention.
Figure 2B:
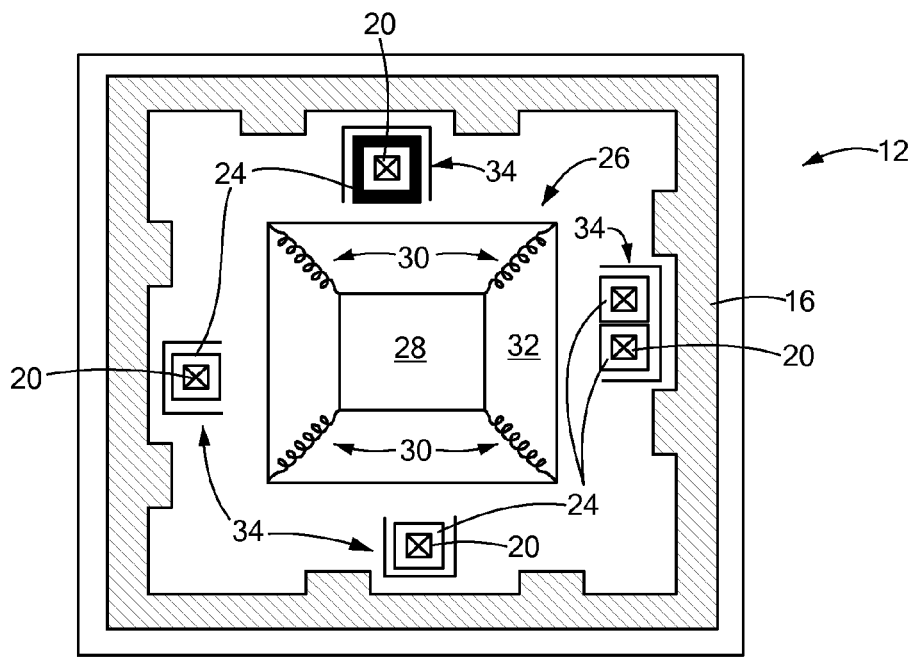
FIG. 2B schematically shows a plan view of a device die in accordance with the first embodiment of the invention.

Specifically, FIG. 2A schematically shows a plan, interior view of a cap die 14 having active circuitry (referred to herein as an "active" cap) before bonding, while FIG. 2B schematically shows a top, inside view of the base die 12, also before bonding. When connected, the two inside surfaces of these dies will face each other and form a chamber as noted above. As shown, the cap die 14 has a portion of the metal seal 16 (also referred to as a "seal ring 16" despite the fact that it is not necessarily round or rounded—and also referred to herein as metal seal or seal ring 16 despite the fact that it is only a part of the entire metal seal 16) encompassing its near outer perimeter, and a plurality of circuit elements 18 within the area defined by the seal ring 16. The seal ring 16, at this precombined stage, may include one metal used to form the ultimate alloy. For example, the cap die seal ring 16 may simply include a layer of aluminum if the base die seal ring 16 (i.e., the portion of the ultimate metal seal 16 formed by the base die 12) includes germanium. Alternatively, the seal ring 16, at this stage, may include a layer of germanium if the base die seal ring 16 includes aluminum. In yet other embodiments, the seal ring 16 of the cap die 14 may comprise an alloy at this stage.

Among other things, the circuit elements 18 may include a plurality of electrical interconnect pads 20 ("cap pads 20") near the seal ring 16, and other circuitry. The circuitry region is shown just schematically as a box. In illustrative embodiments, however, the circuit elements 18, which can include active and passive elements, may be covered with an optional protective layer 22, such as a TiN (titanium nitride) shielding stopper layer.

In a corresponding manner, the base die 12 has electrical interconnect pads 20 ("base pads 20") that electrically connect with the cap pads 20 when the dies are bonded together (FIG. 2B). In fact, this is the primary means of communication between the two dies. The circuitry electrically connects with external devices through pads (not shown) or other interconnection elements (e.g., pins, also not shown) on its outside surface. Thus, the microchip 10 may be mounted to an external device for any number of means, such as using surface mounting or other techniques.

Each base pad 20 may have some electrical isolation means to ensure that it does not short-circuit across the die. To that end, each pad 20 may have an isolation trench 24 formed entirely around it and electrically isolated from other components, such as other pads 20 and the seal ring 16. In other words, the seal ring 16 may have a different potential than those of the various pads 20—they are different electrical nodes. To that end, the isolation trench 24 may have a layer of insulating material, such as nitride, or may simply be an empty void, which is often referred to as an "air filled" trench. Each pad 20 thus has one or more electrical paths (not shown) from it to other components. For example, such an electrical path may be formed using a doped polysilicon layer below the isolation trench 24.

The base die 12 also includes the above noted microstructure 26, which can include a movable mass 28 supported by one or more springs 30 above a stationary substrate 32. As suggested above, movement of the mass 28 produces an electrical signal indicating a change in some physical property. For example, the movable mass 28 may form a variable capacitor with some portion of the stationary substrate 32. A change in capacitance thus may indicate a change in some physical property, such as acceleration, or receipt of an acoustic signal. Rather than or in addition to using capacitive techniques, other embodiments may implement the base structure using piezoelectric techniques.

FIG. 2B also shows the seal ring 16 on the base die 12. In a manner similar to the cap die 14, the base die seal ring 16 may include one metal used to form the ultimate alloy. For example, the base die seal ring 16 may simply include a layer of aluminum if the cap die seal ring 16 has germanium, or a layer of germanium if the cap die seal ring 16 has aluminum. Alternatively, the seal ring 16 of the cap die 14 may comprise an alloy.

Figure 3:
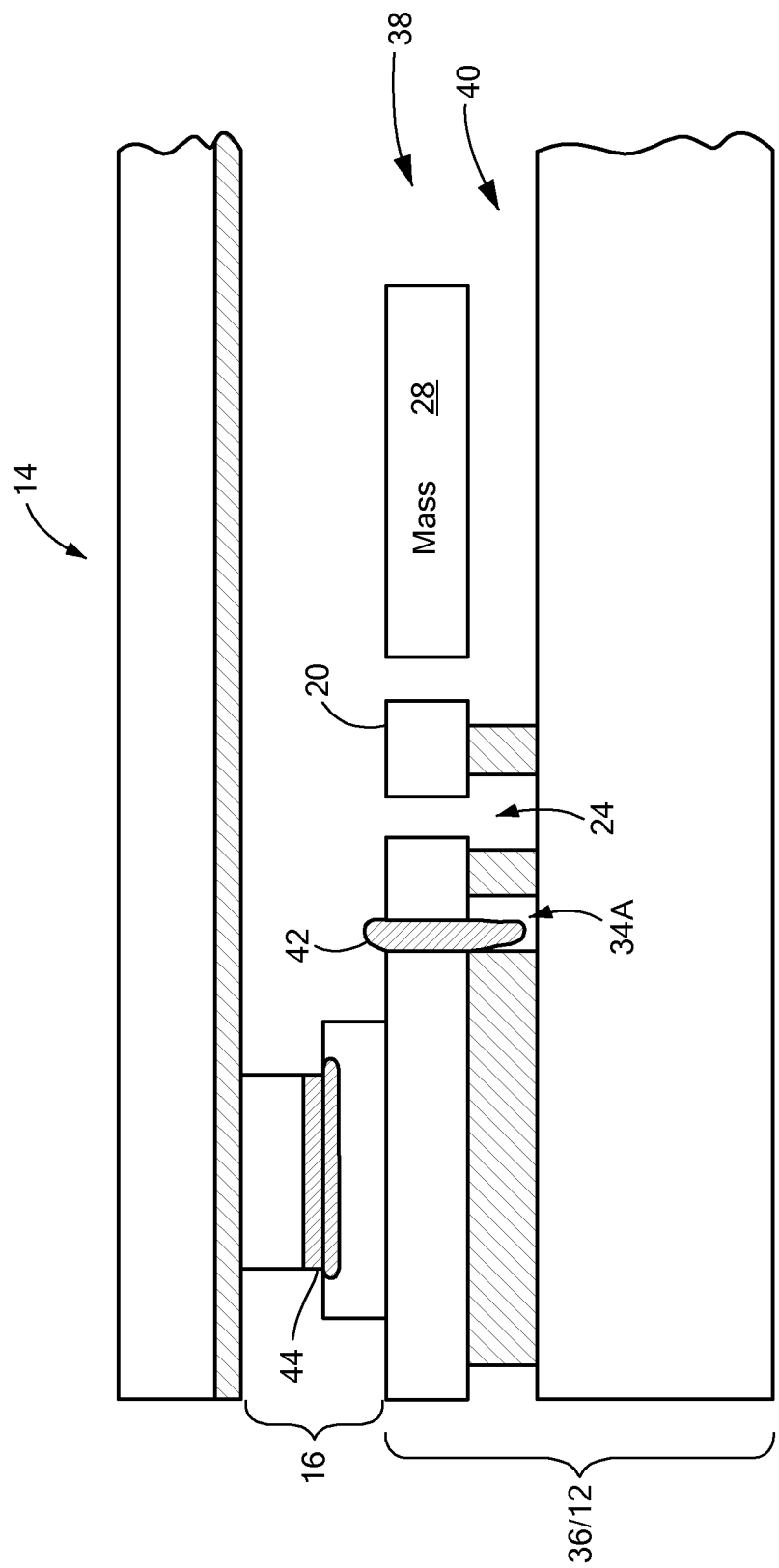
FIG. 3 schematically shows a cross-sectional view of the microchip of FIG. 1 along cross-line X-X in accordance with the first embodiment of the invention.

In accordance with illustrative embodiments of the invention, the base die 12 also includes the above noted blocking trenches 34A along its top surface. FIG. 3, which schematically shows a cross-section of the microchip 10 in this embodiment, shows another view of a blocking trench 34A and other components. As shown in these figures, each blocking trench 34A surrounds at least a portion of one or more electrical interconnects 20. Each blocking trench 34A shown in the figures is disconnected from other blocking trenches 34A. Some embodiments, however, connect one or more, or extend as one single blocking trench 34A about most or all of the base die 12.

As shown, each base pad 20 is positioned close to one side of the base die 12. Specifically, ignoring its thickness, the base die 12 is considered to have two pairs of opposite sides. From the perspective of the drawing in FIG. 2A, one pair of sides includes the right and left sides, while the other pair of sides includes the top and bottom sides. Accordingly, the right side of the base die 12 has a pad 20 closest to it. This pad 20 clearly is closer to the right side of the base die 12 than it is to the left side. The same can be said about the sides near each of the other pads 20. This is relevant because, in illustrative embodiments, the blocking trench 34A for a given pad 20 is between its closest side and its isolation trench 24 (or between its closest side and itself).

To enhance its capacity to retain migrating/leaking metal, the blocking trench 34A may have a variable inner dimension, in which its base is wider than its top opening (e.g., see FIG. 3). As an example, the base die 12 may be formed from a silicon-on-insulator ("SOT") wafer 36. In that case, the movable mass 28 and pad 20 may be formed from the so-called "device layer" or "top layer" (identified by reference number "38") of the SOT wafer 36. The blocking trench 34A thus may be formed by first etching a hole through the (silicon) device layer 38, and then applying a timed acid etch (e.g., using hydrofluoric acid) to the insulative middle layer 40 (known in the art as the "buried insulator" layer), which typically includes an oxide. The acid etch may be timed to form this larger inner dimension, effectively forming an undercut under the silicon layer.

In other embodiments, the blocking trench 34A is formed from material(s) other than oxide supporting polysilicon. For example, the blocking trench 34A can be formed substantially entirely from a single material, such as polysilicon. As another example, the blocking trench 34A can be formed from single crystal silicon and oxide.

FIG. 3 shows some metal that leaked into the blocking trench 34A. This leaked metal is identified by reference number 42. As shown, however, this leaked metal 42 is trapped in the blocking trench 34A and thus, does not access or contact the more interiorly positioned interconnect pad 20. This embodiment thus consequently prevents the leaked metal 42 from electrically connecting the pad 20 with a seal ring 16, thus maintaining the integrity of the microchip 10.

FIG. 3 also shows more details of the seal ring 16 around the entire microchip 10. Specifically, the seal ring 16 has the more pure metal sections near each of its retrospective dies (e.g., germanium concentrated near one die, and aluminum concentrated near the other die), and the eutectic portion 44 generally in its middle where the two metals meet and form the alloy. Application of pressure and heat should spread that eutectic region closer to the dies 12 and 14.

Figure 2C:
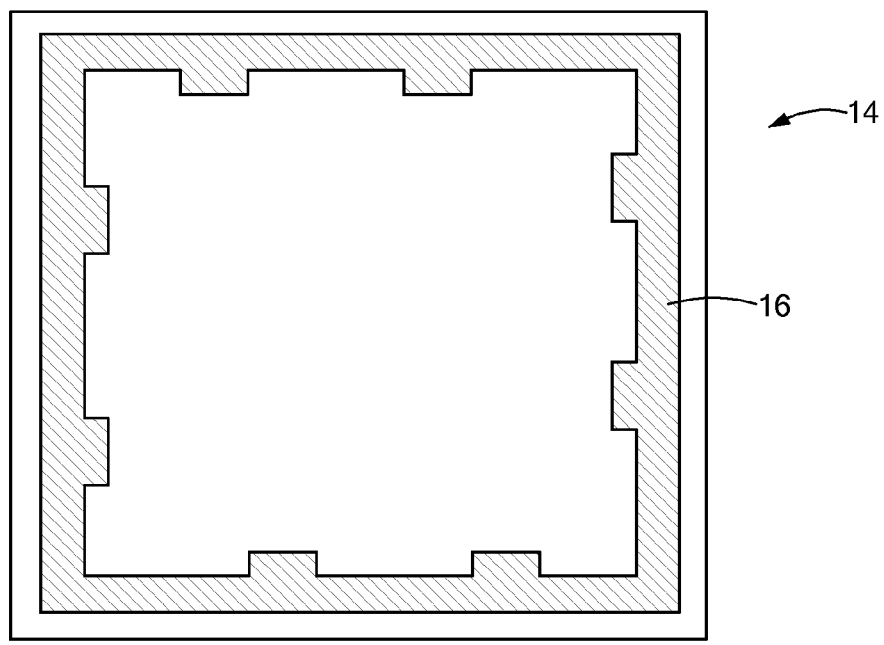
FIG. 2C schematically shows a plan view of a cap die without circuitry in accordance with the first embodiment of the invention.

As noted above, the cap die 14 can have no active or passive circuitry. FIG. 2C schematically shows one embodiment of such a cap die 14. Specifically, as shown, the cap die 14 of this embodiment has a seal ring 16, similar to that discussed above the regard to FIG. 2C. Although not shown, this cap die 14 can have a number of other features.

FIGS. 4A-4C and 5 schematically shows another embodiment, in which the blocking apparatus 34 is formed on the cap die 14 rather than on the base die 12. Specifically, this embodiment has many of the same features as the other embodiments described above with regard to FIGS. 2A-2C and 3. In fact, some of the features of these embodiments can be combined. For example, the microchip 10 can have both types of blocking apparatuses 34.

Figure 5:
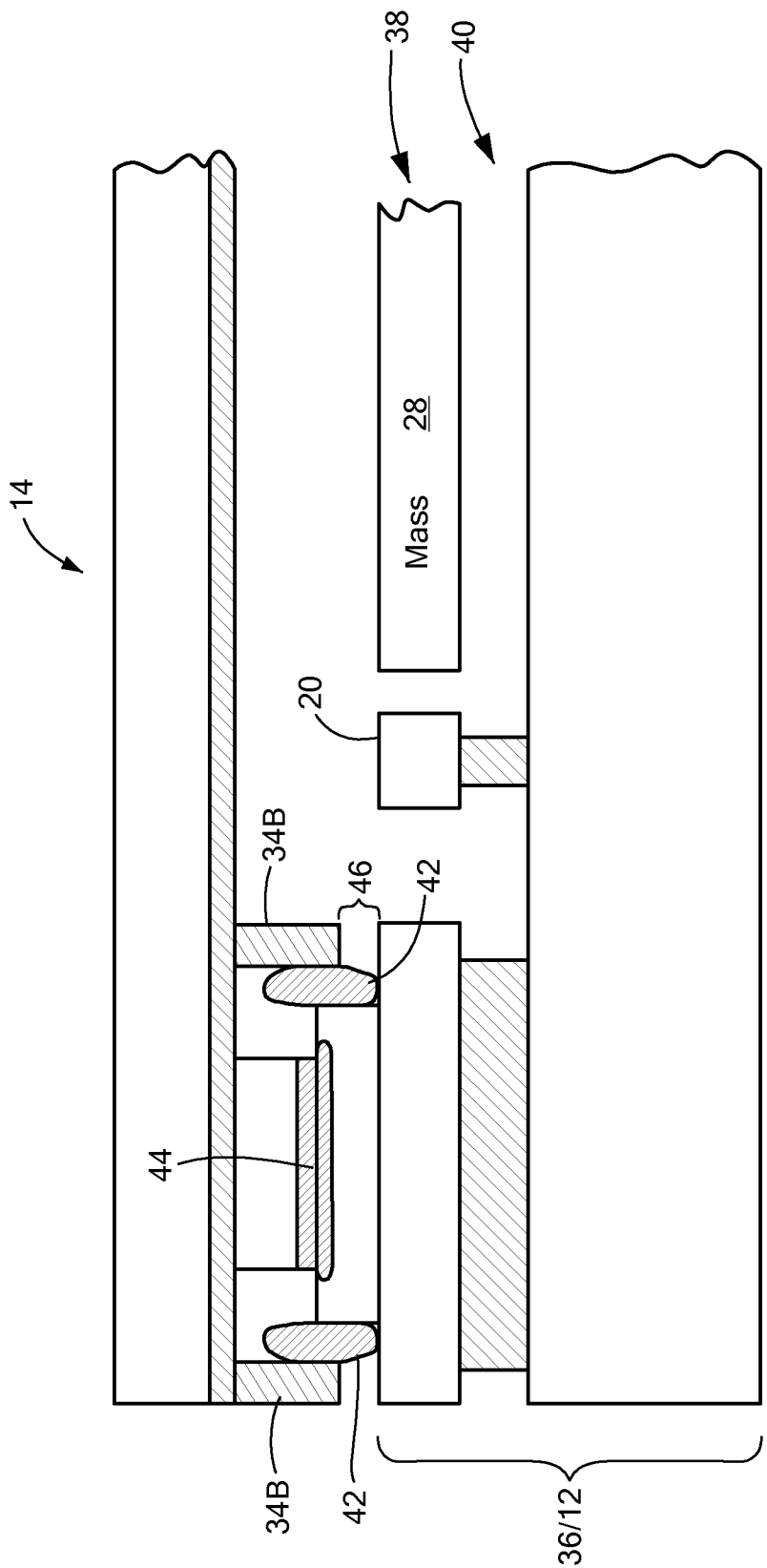
FIG. 5 schematically shows a cross-sectional view of the microchip of FIG. 1 along cross-line X-X in accordance with the second embodiment of the invention.

More specifically, as best shown in FIG. 5, this embodiment does not have the blocking trench 34A. Instead, it has a blocking protrusion 34B, extending downwardly from the cap die 14, between the seal ring 16 and the electrical interconnect 20 (e.g., the pad). In illustrative embodiments, the blocking protrusion 34B is formed from a single metal, such as aluminum or germanium. Some embodiments, however, may form it from an alloy. As shown, the blocking protrusion 34B preferably is positioned between the side closest to its pad 20 and the pad itself. More specifically, the blocking protrusion 34B is between the seal ring 16 portion near the closest side, and the pad 20 itself.

Unlike the seal ring 16, however, the blocking protrusion 34B does not necessarily extend all the way to or contact any part of the base die 12—it forms a space 46 between it and the base die 12. This ensures that it does not react with another metal on the base die 12 to form an alloy having a lower eutectic temperature. Overflowing metal 42 (FIGS. 3 and 5) from the seal ring 16 thus may leak toward the blocking protrusion 34B. Surface tension of the flowing metal 42 nevertheless causes the oozing metal 42 to stop flowing toward the interconnect 20, thus protecting the interconnect 20 from short circuits to the seal ring 16. FIG. 5 schematically shows an example of this leaked metal 42 trapped by the blocking protrusion 34B. In fact, FIG. 5 also shows a second, outer blocking protrusion 34B that provides the same function.

Figure 4A:
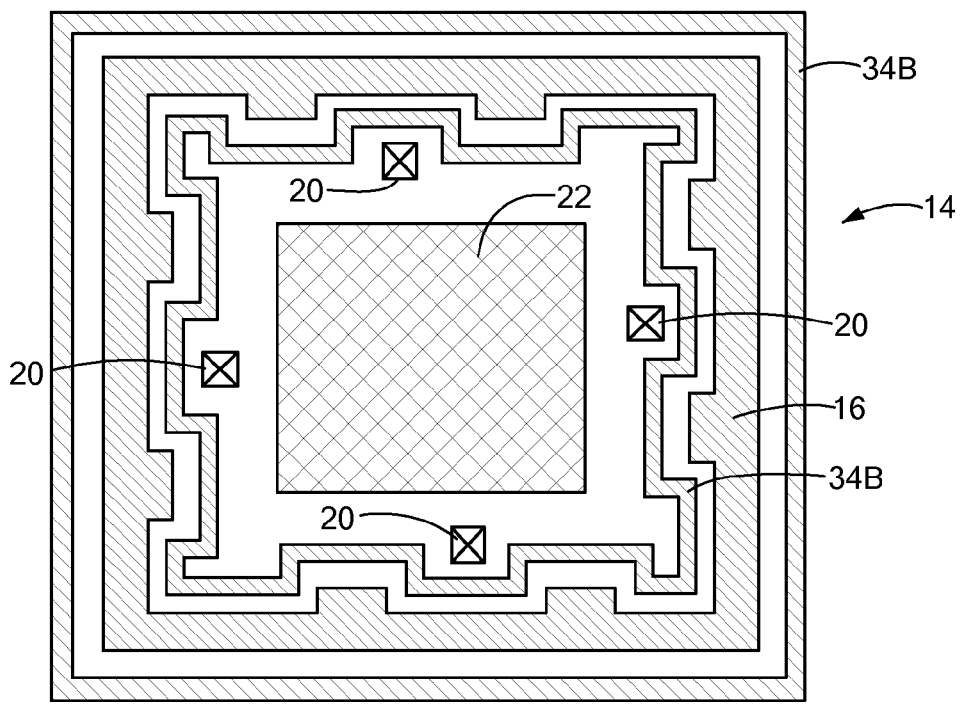
FIG. 4A schematically shows a plan view of a cap die with circuitry in accordance with a second embodiment of the invention.
Figure 4B:
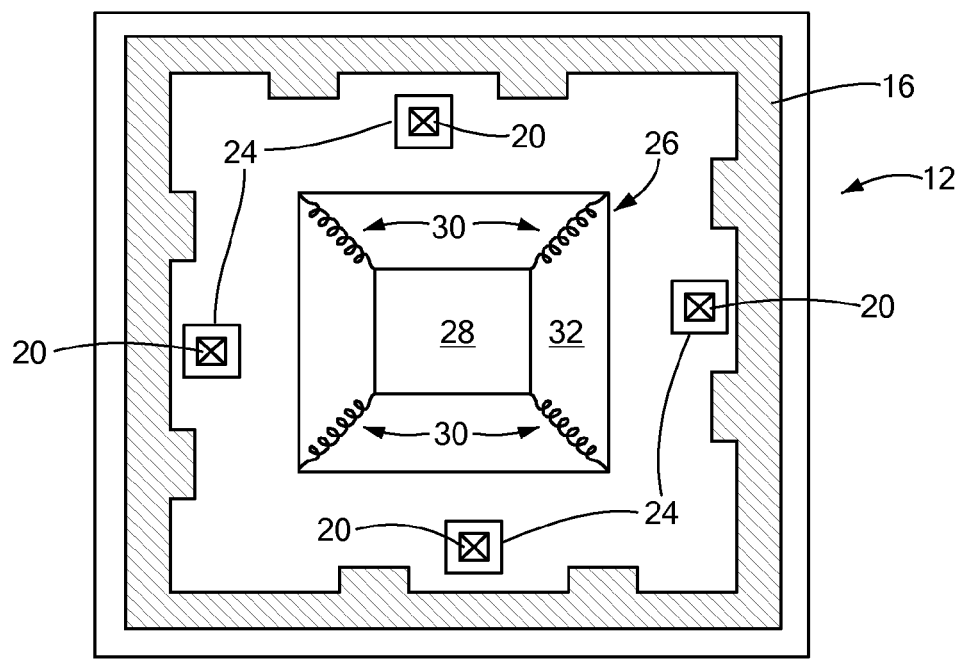
FIG. 4B schematically shows a plan view of a device die in accordance with the second embodiment of the invention.

FIG. 4A schematically shows one example of an active cap die 14 formed in accordance with this embodiment of the invention, while FIG. 4B schematically shows an example of a base die 12 also formed in accordance with this embodiment of the invention. In particular, the active cap die 14 has many similar features to those discussed above with regard to the cap die 14 of FIG. 2A. In contrast, this cap die 14 in this embodiment has the blocking protrusion 34B spanning around its interior. This blocking protrusion 34B forms a region containing the circuit elements 18.

While the blocking protrusion 34B is shown as extending completely around the cap die 14, some embodiments only form the blocking protrusion 34B around or near the interconnects/pads 20. Moreover, FIG. 4A also shows the additional outside blocking protrusion 34B that also protects areas outside of the die during fabrication. This additional outside blocking protrusion 34B also may form an edge protection function during the dicing step of fabrication.

The base die 12 of FIG. 4B can be substantially similar to that discussed above with regard to FIG. 2B, but without the blocking trench(es) 34A. Of course, as noted above, this embodiment also can have the blocking trench(es) 34A. As with the other embodiment, the pads 20 on the cap die 14 electrically connect with the pads 20 on the base die 12 to electrically connect circuit elements 18 with the microstructure 26.

Figure 4C:
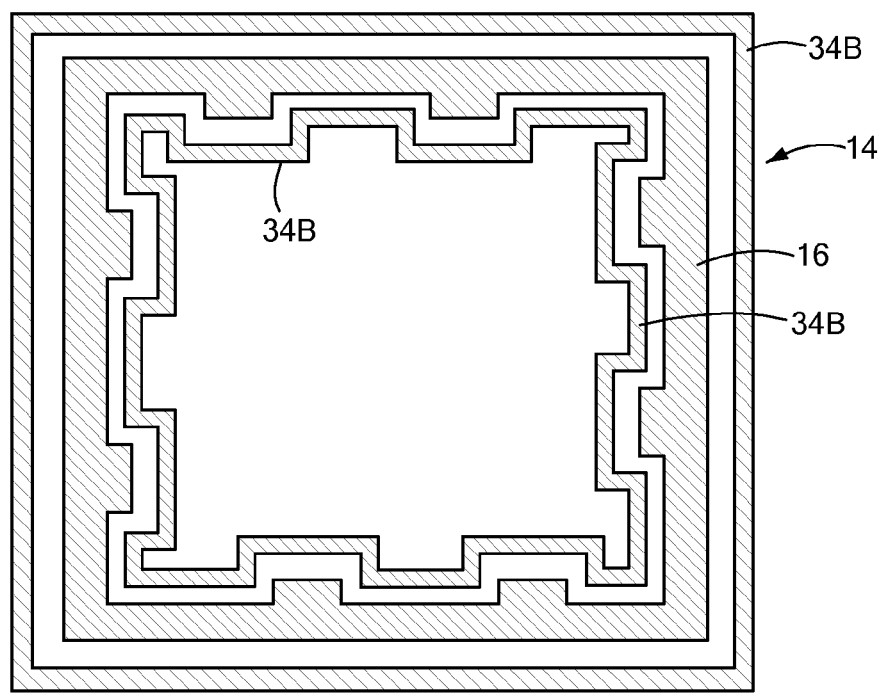
FIG. 4C schematically shows a plan view of a cap die without circuitry in accordance with the second embodiment of the invention.

Also in a manner similar to other embodiments, this embodiment can use a cap die 14 that has no circuitry. FIG. 4C schematically shows one such embodiment, detailing the seal ring 16 and blocking protrusion 34B. Although not shown, this type of cap die 14 also may have the other blocking protrusions 34B.

This embodiment can have multiple blocking protrusions 34B between the seal ring 16 and the pads 20. For example, this embodiment can have two or three blocking protrusions 34B between the seal ring 16 and the pads 20. In a similar manner, the embodiment of FIGS. 2A-2C and 3 can have multiple blocking trenches 34A between the seal ring 16 and the pad 20. The chip designer can take into account the extra microchip real estate that may be required to have these additional features.

Figure 6:
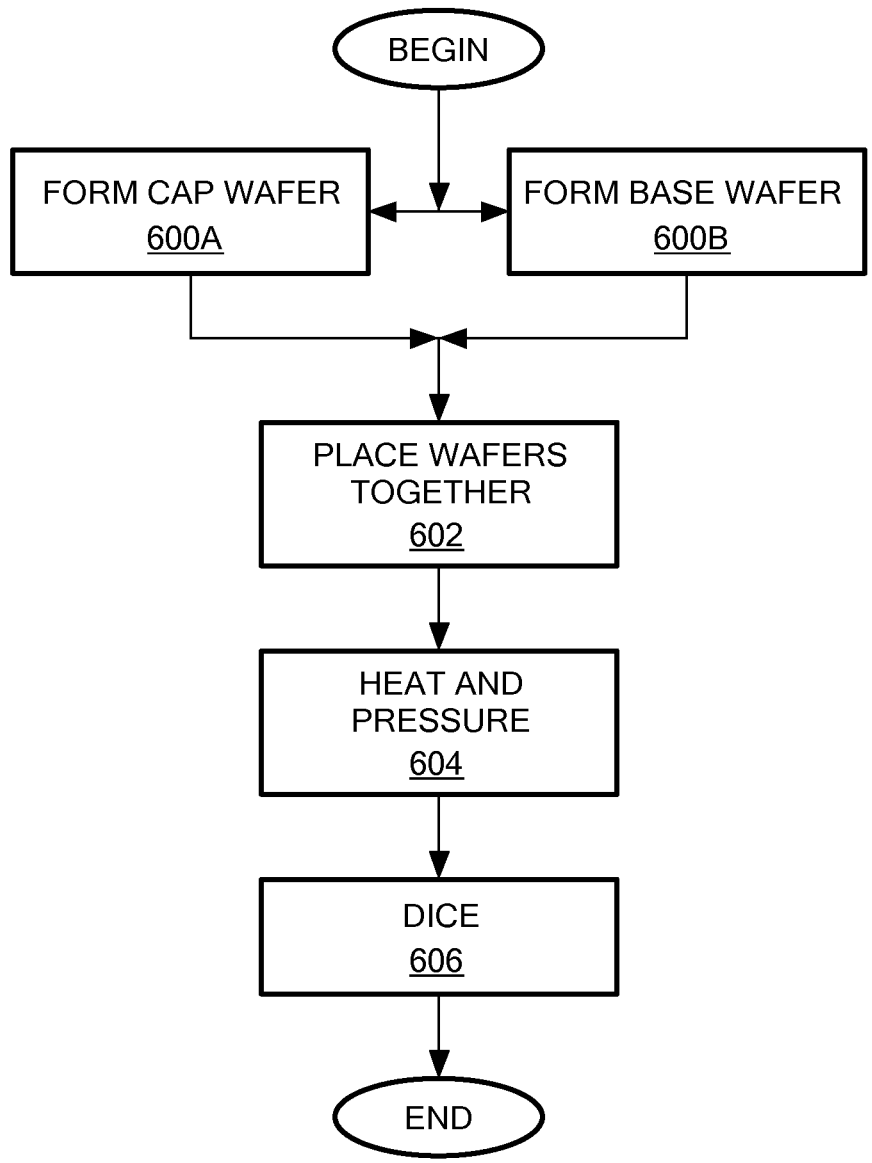
FIG. 6 shows a partial process of fabrication the microchip in FIG. 1 in accordance with various embodiments of the invention.

FIG. 6 shows a process of forming the microchip 10 of FIG. 1 in accordance with various embodiments the invention. It should be noted that this process shows just a few steps of a much longer process of forming the microchip 10. Many of these additional steps were omitted for simplicity to highlight certain aspects of the overall fabrication process. In addition, some of the steps can be performed in a different order than that discussed. Accordingly, those skilled in the art can add further steps or modify the order as they see fit.

The process begins at steps 600A and 600B, both of which may be performed at the same time or in any order. Specifically, the process forms the cap wafer at step 600A, and forms the base wafer at step 600B. Both wafers may be formed by using conventional batch micromachining fabrication processes. Accordingly, each wafer forms a two dimensional array of dies that correspond to similarly positioned dies on the other wafer.

At this point, one wafer may have one metal forming the seal ring alloy, while the other wafer may have the other metal forming the seal ring alloy. For example, each die of the cap wafer may have a germanium ring, while each die in the base wafer may have an aluminum ring.

The process continues to steps 602 and 604, which place the wafers together, forming a so-called "intermediate apparatus." Next, the process applies heat and pressure to the intermediate apparatus. This should cause the two metals to form a eutectic region and alloy and thus, after actively or passively cooling/curing for a specified time, form the seal ring 16. Also during this step, the blocking apparatus 34 should mitigate or completely prevent liquid metal from flowing/oozing/migrating into contact with the base pads 20. In addition, this electrically and physically connects the pads 20 of the cap dies 14 shown in FIGS. 2A and 4A with their respective base die pads 20 of FIGS. 2B and 4B.

Finally, the process concludes at step 606, which dices the wafers along their scribe streets to form a plurality of independent microchips 10. Specifically, these microchips 10 effectively are formed as wafer level chip scale packages. During testing, it was determined that the blocking apparatus 34 of at least one embodiment substantially mitigates the amount of liquid metal flowing onto the pads 20, thus improving yields and reducing per part fabrication costs.

Although the above discussion discloses various exemplary embodiments of the invention, it should be apparent that those skilled in the art can make various modifications that will achieve some of the advantages of the invention without departing from the true scope of the invention.

What is claimed is:

1. A microchip comprising:
    a base die having a top surface with an exposed conductive interconnect, the base die also having an isolation trench around at least a portion of the conductive interconnect, the base die also having two opposed sides, the opposed sides comprising a first side and a second side, the conductive interconnect being positioned closer to the first side than it is to the second side;
    a cap die secured to the base die;
    a seal between the base and the cap, the seal securing the base die with the cap die, the seal comprising a metal material; and
    a blocking trench formed in the base die between the isolation trench and the seal, the blocking trench being formed between the first side and the isolation trench, the blocking trench for at least in part preventing the metal material from electrically contacting the interconnect with the seal,
    wherein the blocking trench contains metal material having substantially the same composition as the seal.

2. The microchip as defined by claim 1 wherein the blocking trench has a top opening and a cavity, the cavity having a larger inner dimension.

3. The microchip as defined by claim 2 wherein the top and trench has a lower portion and an upper portion, the upper portion being closer to the cap die than the lower portion, the lower portion and upper portion meeting to form an undercut, the lower portion having a first inner dimension, the upper portion having an second inner dimension, the first inner dimension being greater than the second inner dimension.

4. The microchip as defined by claim 1 wherein the metal material is an alloy comprising aluminum and germanium.

5. The microchip as defined by claim 1 wherein the base die comprises MEMS microstructure and the cap die comprises circuitry.

6. A microchip comprising:
    a base die having a top surface with an exposed conductive interconnect, the base die also having an isolation trench around at least a portion of the conductive interconnect;
    a cap die secured to the base die;
    a seal between the base and the cap, the seal securing the base die with the cap die, the seal comprising a metal material; and
    a protrusion extending downwardly from the cap die, the protrusion being spaced from and not contacting the base die, the protrusion being between the conductive interconnect and the seal, the protrusion at least in part preventing the metal material from electrically contacting the interconnect with the seal,
    wherein the protrusion is in contact with metal material having substantially the same composition as the seal.

7. The microchip as defined by claim 6 wherein the base die includes MEMS microstructure.

* * * * *